(12) United States Patent
Radke

(10) Patent No.: US 7,369,434 B2
(45) Date of Patent: May 6, 2008

(54) FLASH MEMORY WITH MULTI-BIT READ

(75) Inventor: William Henry Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/503,612

(22) Filed: Aug. 14, 2006

(65) Prior Publication Data

US 2008/0037320 A1    Feb. 14, 2008

(51) Int. Cl.
*G11C 16/08* (2006.01)
(52) U.S. Cl. .......................... 365/185.03; 365/185.02; 365/185.09; 365/200
(58) Field of Classification Search ........... 365/185.02, 365/185.09
See application file for complete search history.

(56) References Cited

U.S. PATENT DOCUMENTS

| | | | |
|---|---|---|---|
| 5,077,737 A | 12/1991 | Leger et al. | |
| 5,754,567 A | 5/1998 | Norman | |
| 5,787,484 A | 7/1998 | Norman | |
| 5,815,458 A | 9/1998 | Chevallier | |
| 5,854,800 A | 12/1998 | Thomann et al. | |
| 5,864,569 A | 1/1999 | Roohparvar | |
| 5,910,921 A | 6/1999 | Beffa et al. | |
| 5,923,682 A | 7/1999 | Seyyedy | |
| 5,925,138 A | 7/1999 | Klein | |
| 5,935,258 A | 8/1999 | Klein | |
| 6,034,891 A | 3/2000 | Norman | |
| 6,076,182 A | 6/2000 | Jeddeloh | |
| 6,112,314 A | 8/2000 | Norman et al. | |
| 6,141,247 A | 10/2000 | Roohparvar et al. | |
| 6,178,537 B1 | 1/2001 | Roohparvar | |
| 6,279,072 B1 | 8/2001 | Williams et al. | |
| 6,331,948 B2 * | 12/2001 | Kasai et al. ........... | 365/185.09 |
| 6,381,672 B1 | 4/2002 | Strongin et al. | |
| 6,657,899 B2 | 12/2003 | Roohparvar | |
| 6,728,825 B1 | 4/2004 | Norman | |
| 6,734,865 B1 | 5/2004 | Peterson et al. | |
| 6,741,253 B2 | 5/2004 | Radke et al. | |
| 6,775,168 B1 | 8/2004 | Park et al. | |
| 6,784,889 B1 | 8/2004 | Radke | |
| 6,838,331 B2 | 1/2005 | Klein | |
| 6,870,749 B1 | 3/2005 | Park et al. | |
| 6,870,774 B2 | 3/2005 | Roohparvar et al. | |
| 6,883,044 B1 | 4/2005 | Roohparvar | |
| 6,906,691 B2 | 6/2005 | Park et al. | |

(Continued)

OTHER PUBLICATIONS

"Micron ECC Module for NAND Flash via Xllinx Spartan-3 FPGA", *Micron Technical Note 2906*, (2005).

(Continued)

*Primary Examiner*—Tan T. Nguyen
(74) *Attorney, Agent, or Firm*—Schwegman, Lundberg & Woessner, P.A.

(57) ABSTRACT

A memory device is described that uses extra data bits stored in a multi-level cell (MLC) to provide error information. An example embodiment provides a memory cell that uses more than $2^X$ logic levels to store X data bits and an error bit. At least one extra bit provided during a read operation is used to provide error information or a confidence factor of the X data bits originally stored in the cell.

24 Claims, 2 Drawing Sheets

U.S. PATENT DOCUMENTS

| | | |
|---|---|---|
| 6,982,900 B2 * | 1/2006 | Hirabayashi ................ 365/154 |
| 6,987,684 B1 | 1/2006 | Branth et al. |
| 6,999,376 B2 | 2/2006 | Roohparvar |
| 7,096,406 B2 * | 8/2006 | Kanazawa et al. .......... 714/763 |
| 7,196,928 B2 | 3/2007 | Chen |
| 2001/0023475 A1 | 9/2001 | Palowski |
| 2002/0070941 A1 | 6/2002 | Peterson et al. |
| 2003/0041210 A1 | 2/2003 | Keays |
| 2003/0067472 A1 | 4/2003 | Radke et al. |
| 2003/0115538 A1 | 6/2003 | Derner et al. |
| 2004/0183808 A1 | 9/2004 | Radke et al. |
| 2005/0172207 A1 | 8/2005 | Radke et al. |
| 2005/0268203 A1 | 12/2005 | Keays et al. |
| 2006/0098484 A1 * | 5/2006 | Roohparvar ........... 365/185.09 |
| 2006/0248434 A1 | 11/2006 | Radke et al. |
| 2007/0171714 A1 * | 7/2007 | Wu et al. .............. 365/185.09 |
| 2007/0206434 A1 | 9/2007 | Radke |

OTHER PUBLICATIONS

"NAND Flash Memory MT29F4G08AAA, MT29F8G08BAA, MT29F8G08DAA, MT29F16G08FAA", (Aug. 2006),81 pgs.

"Non-Final Office Action Mailed Oct. 19, 2007 in U.S. Appl. No. 11/276477", OARN, 9.

* cited by examiner

FLASH MEMORY WITH MULTI-BIT READ

FIELD OF THE INVENTION

The present invention relates to non-volatile memory devices and, more particularly, to flash memory devices.

BACKGROUND

Flash memory is non-volatile, which means that it stores information on a semiconductor in a way that does not need power to maintain the information in the chip. Flash memory stores information in an array of transistors, called "cells," each of which stores one or more bits of information. Current flash memory devices are made in two forms: NOR flash and NAND flash. The names refer to the type of logic used in the storage cell array.

A flash cell is similar to a standard MOSFET transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current can be sensed and translated into 1's and 0's, reproducing the stored data.

During data read and write functions, voltage coupling can influence proper memory operation. Further, close physical proximity of memory cells can result in cell to cell coupling that can influence proper memory operation and data accuracy.

For reasons stated below which will become apparent to those skilled in the art upon reading and understanding the present specification, there is a need for methods and devices to detect errors present in stored data.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice, as is well known in the art. The figures are provided to help facilitate an understanding of the detailed description, are not intended to be accurate in scale, and have been simplified. The term conductor as used herein is intended to include conductors and semi-conductors, including but not limited to metals, metal alloy, doped silicon and polysilicon.

The following detailed description is, therefore, not to be taken in a limiting sense, and the scope of the present invention is defined only by the appended claims, along with the full scope of equivalents to which such claims are entitled.

Figure 1:
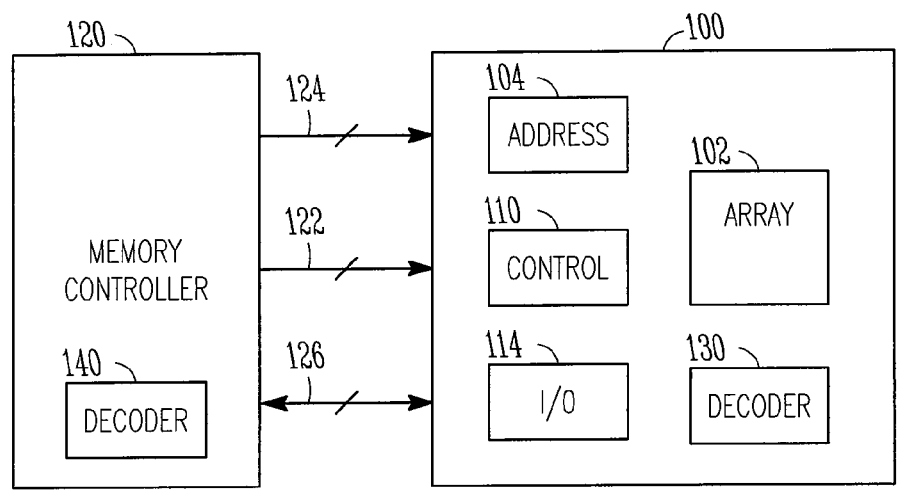
FIG. 1 is a block diagram of a memory device according to embodiments of the present invention.

FIG. 1 is a simplified block diagram of an integrated circuit memory device 100 in accordance with an embodiment of the invention. The memory device 100 includes an array of non-volatile floating gate memory cells 102, address circuitry 104, control circuitry 110, and Input/Output (I/O) circuitry 114. The memory cells are also referred to as Flash memory cells because blocks of memory cells are typically erased concurrently, in a 'flash' operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data can be written to or read from the memory cells across data, DQ, lines 126.

In addition to general memory functions, control circuit 110 performs a read operation on the memory cells. As explained below, the read operation provides error bit(s) in addition to data to allow for a more informed reading of data. The memory cells of FIG. 1, in one embodiment, have greater than $2^X$ data levels used to read X bits of data, where X is an integer. The additional data levels not used as the X bits are provided as error bit(s).

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Figure 2:
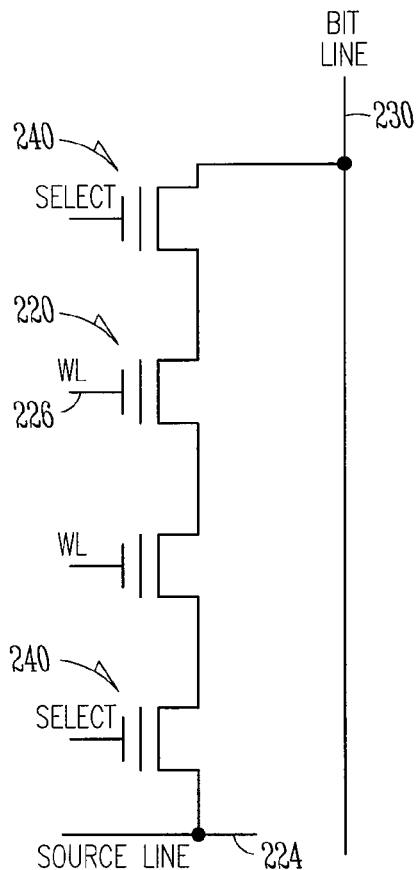
FIG. 2 illustrates a simplified portion of a NAND flash memory array of an embodiment of FIG. 1.

FIG. 2 illustrates a simplified portion of a NAND flash memory array of an embodiment of FIG. 1. NAND Flash uses electron tunnel or electron injection for writing and tunnel release for erasing. The NAND memory includes floating gate memory cells 220 coupled to source line 224, word lines 226 and a bit line 230. The cells are coupled in series between the bit line and source line. One or more bit line select transistors 240 are used to selectively isolate the cells from the bit and source lines.

In a read operation, a word line of a target (selected) memory cell can be adjusted to predetermined voltage levels for reading multiple state levels of the multi-level cells (MLC). All unselected cell word lines are coupled to a voltage sufficiently high to activate the unselected cells regardless of their floating gate charge. Depending upon the programmed state of the MLC selected cell, the word line may activate the selected cell.

In prior art, memory cells have been used to store one data bit in a binary manner as either a first or second data state. For example, a logic one may be stored as a charge on a dynamic cell and a logic zero is represented by a discharged dynamic cell. Likewise, the flash cell stores one bit as a threshold activation level. To increase data storage capacity, prior art multiple level memory cells were developed to allow for storage of multiple data bits. As such, a two state memory cell stores one bit of data and a four state memory cell is used to store two bits of data. Thus, a prior art memory cell with $2^X$ states stores X bits of data.

Embodiments of the present invention use multilevel memory cells to store a single bit of data. In contrast to traditional multilevel cells the invention does not increase memory device capacity by using multilevel cells, but uses the extra states of the memory cell for error information.

Figure 3:
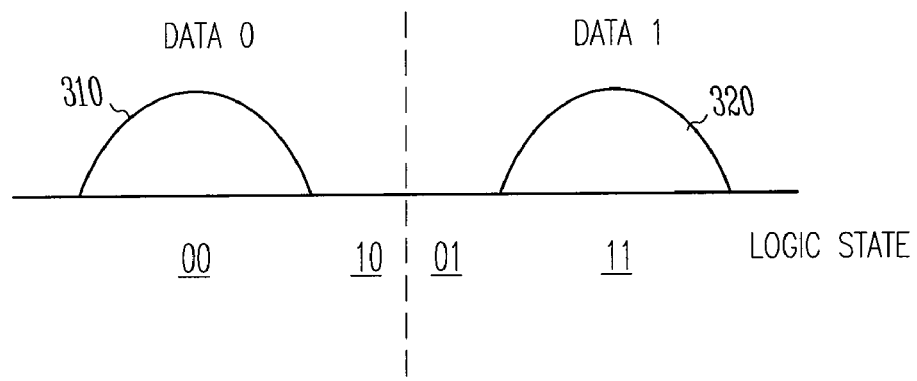
FIG. 3 illustrates data states of memory cells of an array of FIG. 1.

Distributions of logic states for a plurality of memory cells of a memory device is illustrated in FIG. 3. A four state memory cell is programmed to either a binary "00" data state or a "11" data state to represent a logic zero or one, respectively. The "01" and "10" data states are not used during programming. Thus, the least significant bit (LSB) provides the data to be retained by the memory and the most significant bit is used as an error bit. During a read operation, the memory cell data state is read and provided to a decoder. The decoder 130 can be located within the memory device 100 or external to the memory device, such as decoder 140 with the processor 120 of FIG. 1.

If the memory cell output is a "00" data state or a "11" data state, the cell data represents a strong logic zero (curve 310) or one (curve 320), respectively. If the memory cell output is a "01" or a "10" data state, the cell data represents a weak logic zero or one, respectively. That is, a weak data state indicates that the original data state of the memory cell has changed and the data bit may be erroneous.

State changes in a multilevel cell are possible. However, multiple state changes where both bits of data change are much less likely. By programming the multilevel cell using the LSB to store the data, the probability of both bits changing is reduced.

Figure 4:
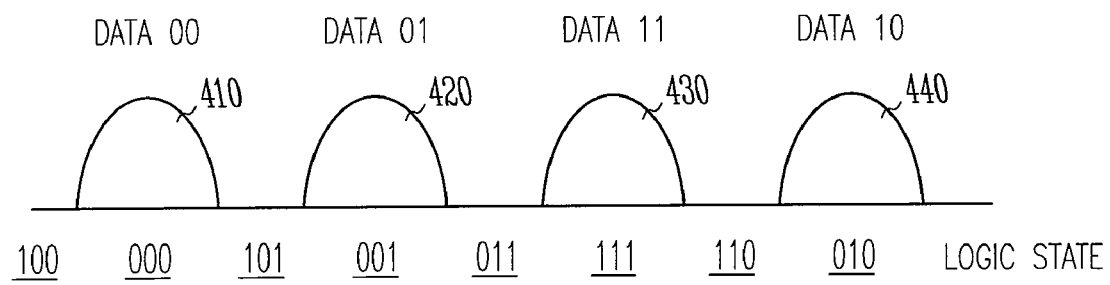
FIG. 4 illustrates data states of memory cells of an array of FIG. 1.

The present invention is not limited to the above example but can use eight data states to store two data bits and an error bit. As illustrated in FIG. 4, two data bits 00, 01, 11 and 10 are programmed into a memory as 000, 001, 111 and 010, respectively. As shown in curves 410, 420, 430 and 440 the two data bits and an error bit can be decoded. When the error bit state is changed from the programmed error bit state possible errors in the stored data can be flagged.

As such, four data levels are used to store one bit of data and an error bit and seven data levels are used to store two bits of data and an error bit. Additional embodiments provide a memory cell that uses greater than $2^X$ data levels to store X bits of data and at least one error bit, where X is an integer. In an embodiment where X=2, seven levels can be used: the 4 expected data states ($2^X$), and three additional intermediate values. The values beyond 00 and 11 are not used. In one embodiment a memory cell uses $2^{X+1}$ data levels to store X bits of data.

As explained above, the extra data states output from the memory cell are used by a decoder circuit to identify errors in the data and provide a confidence factor for the data. In addition to identifying suspect data, the extra data states can provide additional information for error detection and correction circuitry.

Although embodiments have been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The invention claimed is:

1. A memory device comprising:
   a multilevel memory cell to store more than $2^X$ data levels representing X bits of data and an error bit; and
   a decoder circuit coupled to receive output from the memory cell and decode the $2^X$ data levels and determine a confidence factor for the X bits of data using the error bit.

2. The memory device of claim 1 wherein the multilevel memory cell is a non-volatile memory cell.

3. The memory device of claim 1 wherein X is one and the more than $2^X$ data levels are 00, 01, 10 and 11, such that the data level 00 is decoded as data bit zero with a high confidence factor, the data level 01 is decoded as data bit zero with a low confidence factor, the data level 11 is decoded as data bit one with a high confidence factor, and data level 10 is decoded as data bit one with a low confidence factor.

4. The memory device of claim 3, wherein the multilevel memory cell is a non-volatile memory cell.

5. The memory device of claim 1, wherein a first of the data levels is a first value with a high confidence factor, wherein a second of the data levels is the first value with a low confidence factor, wherein the third of the data levels is a second value with a high confidence factor, and wherein a fourth of the data levels is the second value with a low confidence factor.

6. A non-volatile memory device comprising:
   a multilevel memory cell to store four data levels representing 00, 01, 10 and 11 binary logic states;
   control circuitry to program the multilevel memory cell to either the 00 or 11 data state, wherein the 00 data state represents a single bit of data of logic state 0, and wherein the 11 data state represents a single bit of data of logic state 1; and
   a decoder circuit coupled to receive output from the memory cell and decode the output, wherein the decoder circuit indicates an error in the read data when the 01 or 10 data states are output from the memory cell.

7. A system comprising:
   a memory device comprising multilevel memory cells programmable to one of more than $2^X$ logic states; and
   a decoder circuit coupled to receive output from the memory cell, wherein the decoder circuit decodes one of the more than $2^X$ logic states into X data bits and determines a confidence factor for the X data bits based upon an error bit decoded from the one of the more than $2^X$ logic states.

8. The system of claim 7 further comprising an error correction circuit to correct data errors identified by the confidence factor.

9. The system of claim 7 wherein the multilevel memory cells are non-volatile memory cells.

10. A method of storing data comprising:
    storing X bits of data as one of more than $2^X$ logic states in a memory cell;

reading the one of the more than $2^X$ logic states from the memory cell; and decoding the more than $2^X$ data states to provide the X bits of data and an error bit indicating a confidence factor for the X bits.

11. The method of claim 10 further comprising applying an error correction to the decoded more than $2^X$ logic states.

12. The method of claim 10 wherein the more than $2^X$ logic states are stored in a single memory cell.

13. The method of claim 12 wherein the memory cell is a non-volatile flash memory cell.

14. A method of operating a memory device comprising:
storing data in a multi-level cell (MLC), wherein each memory cell has at least four state levels capable of storing at least first and second information bits; and
decoding data read from the memory cell wherein the second information bit indicates an error state of the memory cell.

15. The method of claim 14 wherein the memory cell is a non-volatile flash memory cell.

16. The method of claim 14 wherein the MLC stores more than $2^X$ data levels representing X bits of data and an error bit.

17. The method of claim 14 wherein the first information bit is a least significant bit of the at least four state levels represented in binary logic.

18. A method of detecting data errors in a multi-level cell (MLC) memory device comprising:
storing a data bit and an extra data bit in a multi-level memory cell; and
reading the data bit and the extra data bit from the multi-level cell, wherein the extra data bit indicates a possible data error of the data bit, such that a state change of the extra data bit between storing and reading the extra data bit indicates the possible error.

19. The method of claim 18 wherein the data bit and the extra data bit are stored with common binary data states.

20. The method of claim 19 wherein the data bit is a least significant bit and the extra data bit is a most significant bit.

21. The method of claim 18 wherein the multi-level memory cell is a non-volatile memory cell.

22. A method of detecting data errors in a multi-level cell (MLC) memory device comprising:
storing X bits of data to a memory cell configurable to $2^{X+1}$ logic states in a multi-level memory cell of a memory device;
storing an extra data bit to the multi-level memory cell; and
reading the X data bits and the extra data bit from the multi-level cell, wherein the extra data bit indicates possible data error of the X data bits, such that a state change of the extra data bit between storing and reading operations indicates the possible error.

23. The method of claim 22 wherein X is either one or two.

24. The method of claim 22, wherein reading includes reading from a nonvolatile memory.

* * * * *

UNITED STATES PATENT AND TRADEMARK OFFICE
CERTIFICATE OF CORRECTION

PATENT NO. : 7,369,434 B2
APPLICATION NO. : 11/503612
DATED : May 6, 2008
INVENTOR(S) : Radke It is certified that error appears in the above-identified patent and that said Letters Patent is hereby corrected as shown below:

On the face page, in field (56), under "Other Publications", in column 2, line 1, delete "Xllinx" and insert -- Xilinx --, therefor.

In column 4, line 34, in Claim 5, after "wherein" delete "the" and insert -- a --, therefor.

Signed and Sealed this

Nineteenth Day of August, 2008

JON W. DUDAS
*Director of the United States Patent and Trademark Office*